United States Patent
Lung et al.

(10) Patent No.: US 8,030,634 B2
(45) Date of Patent: Oct. 4, 2011

(54) MEMORY ARRAY WITH DIODE DRIVER AND METHOD FOR FABRICATING THE SAME

(75) Inventors: Hsiang-Lan Lung, Elmsford, NY (US); Min Yang, Yorktown Heights, NY (US); Thomas D. Happ, Dresden (DE); Bipin Rajendran, White Plains, NY (US)

(73) Assignees: Macronix International Co., Ltd., Hsinchu (TW); International Business Machines Corporation, Armonk, NY (US); Qimonda AG, Munich (DE)

( * ) Notice: Subject to any disclaimer, the term of this patent is extended or adjusted under 35 U.S.C. 154(b) by 575 days.

(21) Appl. No.: 12/060,075

(22) Filed: Mar. 31, 2008

(65) Prior Publication Data

US 2009/0242865 A1    Oct. 1, 2009

(51) Int. Cl.
*H01L 29/02* (2006.01)
*H01L 47/00* (2006.01)

(52) U.S. Cl. ... 257/2; 257/5; 257/E29.002; 257/E47.001

(58) Field of Classification Search ........... 257/2–5, 257/E29.002, E29.003, E29.005–E29.007, 257/E47.001
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |

(Continued)

FOREIGN PATENT DOCUMENTS

WO    WO-0079539    12/2000

(Continued)

OTHER PUBLICATIONS

"Magnetic Bit Boost," www.sciencenews.org, Dec. 18 & 25, 2004, p. 389, vol. 166.

(Continued)

*Primary Examiner* — Anh Phung
*Assistant Examiner* — Allison P Bernstein
(74) *Attorney, Agent, or Firm* — Haynes Beffel & Wolfeld LLP

(57) ABSTRACT

A memory array with self-centered diode access devices results from a process in which diodes are formed in the fill material, each diode having a lightly-doped first layer of the same conductivity type as the conductive lines; a heavily doped second layer of opposite conductivity type; and a conductive cap. Self-aligned, and self-centered spacers in the self-aligned vias define pores that expose the conductive cap. Memory material is deposited within the pores, the memory material making contact with the conductive cap. A top electrode is formed in contact with the memory material.

9 Claims, 12 Drawing Sheets

U.S. PATENT DOCUMENTS

| | | |
|---|---|---|
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,805,563 B2 | 10/2004 | Ohashi et al. |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |

| | | |
|---|---|---|
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,449,710 B2 | 11/2008 | Lung |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0029587 A1 | 2/2005 | Harshfield |
| 2005/0062087 A1 | 3/2005 | Chen et al. |
| 2005/0093022 A1 | 5/2005 | Lung |
| 2005/0127349 A1 | 6/2005 | Horak et al. |
| 2005/0145984 A1 | 7/2005 | Chen et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2005/0270832 A1 | 12/2005 | Chu et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2009/0166600 A1 | 7/2009 | Park et al. |

FOREIGN PATENT DOCUMENTS

| | | |
|---|---|---|
| WO | WO-0145108 | 6/2001 |
| WO | WO-0225733 | 3/2002 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage, " Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.
PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

MEMORY ARRAY WITH DIODE DRIVER AND METHOD FOR FABRICATING THE SAME

PARTIES TO A JOINT RESEARCH AGREEMENT

International Business Machines Corporation, a New York corporation; Macronix International Corporation, a Taiwan corporation, and Infineon Technologies AG, a German corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and to methods for manufacturing such devices.

2. Description of Related Art

Programmable resistive materials, including phase change based materials, have been used in nonvolatile random access memory cells. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term amorphous is used to refer to a relatively less ordered structure, more disordered than a single crystal, which has detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material may be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from a crystalline state to an amorphous state. The magnitude of the needed reset current can be reduced by reducing the volume of the active region in the phase change material element in the cell. Techniques used to reduce the volume of the active region include reducing the contact area between electrodes and the phase change material, so that higher current densities are achieved in the active volume, with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued 11 Nov. 1997; Zahorik et al., "Method of Making Chalogenide [sic] Memory Device," U.S. Pat. No. 5,789,277, issued 4 Aug. 1998; Doan et al., "Controllable Ovonic Phase-Change Semiconductor Memory Device and Methods of Fabricating the Same," U.S. Pat. No. 6,150,253, issued 21 Nov. 2000.

Another memory cell structure under development, referred to sometimes as a "mushroom" cell because of the shape of the active region on the bottom electrode in a typical structure, is based on the formation of a small electrode in contact with a larger portion of phase change material, and then a usually larger electrode in contact with an opposite surface of the phase change material. Current flow from the small contact to the larger contact is used for reading, setting and resetting the memory cell. The small electrode concentrates the current density at the contact point, so that an active region in the phase change material is confined to a small volume near the contact point. See, for example, Ahn et al., "Highly reliable 50 nm contact cell technology for 256 Mb PRAM," VLSI Technology 2005 Digest of Technical Papers, pages 98-99, 14 Jun. 2005; Denison, International publication No. WO2004/055916 A2, "Phase Change Memory and Method Therefore," Publication Date: 1 Jul. 2004; and Song et al., United States Patent Application Publication No. US 2005/0263829 A1, "Semiconductor Devices Having Phase Change Memory Cells, Electronic Systems Employing the Same and Methods of Fabricating the Same," published 1 Dec. 2005.

Another problem with manufacturing very small dimension structures is alignment. When the structures are made using separate lithographic steps, the sizes of the structures, or of at least one of them, must be large enough to allow for alignment tolerances in the lithographic process. These requirements can restrict the flexibility in the design of the memory cells, and cause variation in the performance of the cells.

A self-aligned, nonvolatile memory structure based upon phase change material is described in U.S. Pat. No. 6,579,760 entitled Self-Aligned Programmable Phase Change Memory, invented by Hsiang-Lan Lung, issued Jun. 17, 2003. The memory structure can be made within a very small area on an integrated circuit. For example, the area required for each memory cell in an array is about $4F^2$, where F is equal to the minimum line width for the manufacturing process. Thus, for processes having a minimum line width of 0.1 microns, the memory cell area is about 0.04 microns squared.

Memory cells, including a stack of materials forming diode access devices and a layer of phase change material, are defined at intersections of bit lines and word lines, and have dimensions that are defined by the widths of the bit lines and word lines in a self-aligned process. However, the dimensions of the word lines and bit lines are still quite large, as compared for example to the size of a pore in a pore-type memory cell. Thus it is desirable to provide a high-density array technology, using self-aligned technology, and which provides for formation of very small pores It is desirable therefore to provide a reliable method for manufacturing a memory cell structure with self-aligning and self-converging control over the critical dimensions of the pore cell, which will work with high density integrated circuit memory devices.

SUMMARY OF THE INVENTION

A memory array is described, comprising a structure, including dielectric fill material and having conductive lines, arranged in one embodiment as word lines, at a lower portion thereof. A plurality of vias in the structure are positioned over corresponding conductive lines. A pore-type memory element is formed within each via, and contains a diode, coupled to a corresponding conductive line in the substrate, and memory material in contact with a contact surface on the diode. Each diode comprises for example a first semiconductor layer having a first conductivity type, a second semiconductor layer having a second conductivity type, and a conductive cap, where the diode does not completely fill the via. A pore within the each via is defined by a spacer on an interior sidewall of the via, the spacer defining a self-centered opening in the center of the via, exposing the contact surface of the diode. Memory material within the self-centered opening in the center of the via contacts the conductive cap. A top electrode contacts the memory material. Optionally, a plurality of bit lines overlie the top electrodes, and connect the memory cells into the columns of the array. Alternatively, the top electrodes comprise portions of the bit lines themselves, in contact with the memory material in the vias along a column in the array.

A method of fabricating a memory array is described. The method basically comprises the steps of:

providing a structure, including a dielectric fill material and having conductive lines at a lower portion thereof, forming diodes in the dielectric fill material coupled to corresponding conductive lines in the structure, with self-aligned vias over the diodes;

forming spacers on interior sidewalls of the vias, each spacer defining a self-centered opening in the center of the via exposing the diode depositing memory material to fill the self-centered openings making contact with the diodes; and forming top electrodes in contact with the memory material.

A method described herein begins with a structure, generally composed of dielectric fill material and having conductive lines formed at its lower portion, and a sacrificial layer formed on its upper surface. Silicon plugs are formed in the structure. First, silicon is removed from the plugs, to a depth of, for example, about half the thickness of the structure, thereby forming a recess. Then, diodes are formed in the silicon plugs, each diode having a lightly-doped first layer of the same conductivity type as the conductive lines; a heavily doped second layer of opposite conductivity type; and a conductive cap. An etching step expands the volume of the recess by etching dielectric material to undercut the sacrificial layer. A fill layer is deposited into the undercut recess, thereby forming a void within its center. The fill layer is etched to penetrate the void, defining self-aligned spacers in the recess adjacent the conductive cap. The etching is continued to expose the conductive cap at the center of the spacers. Memory material is deposited to fill the recess, the memory material making contact with the conductive cap. Finally, a top electrode is formed in the upper portion of the memory material.

In other embodiments, the diodes are formed using deposition of doped semiconductor layers, rather than the implanting of a semiconductor plug.

Other aspects and advantages of the invention are described below with reference to the figures.

DETAILED DESCRIPTION

Figure 1:
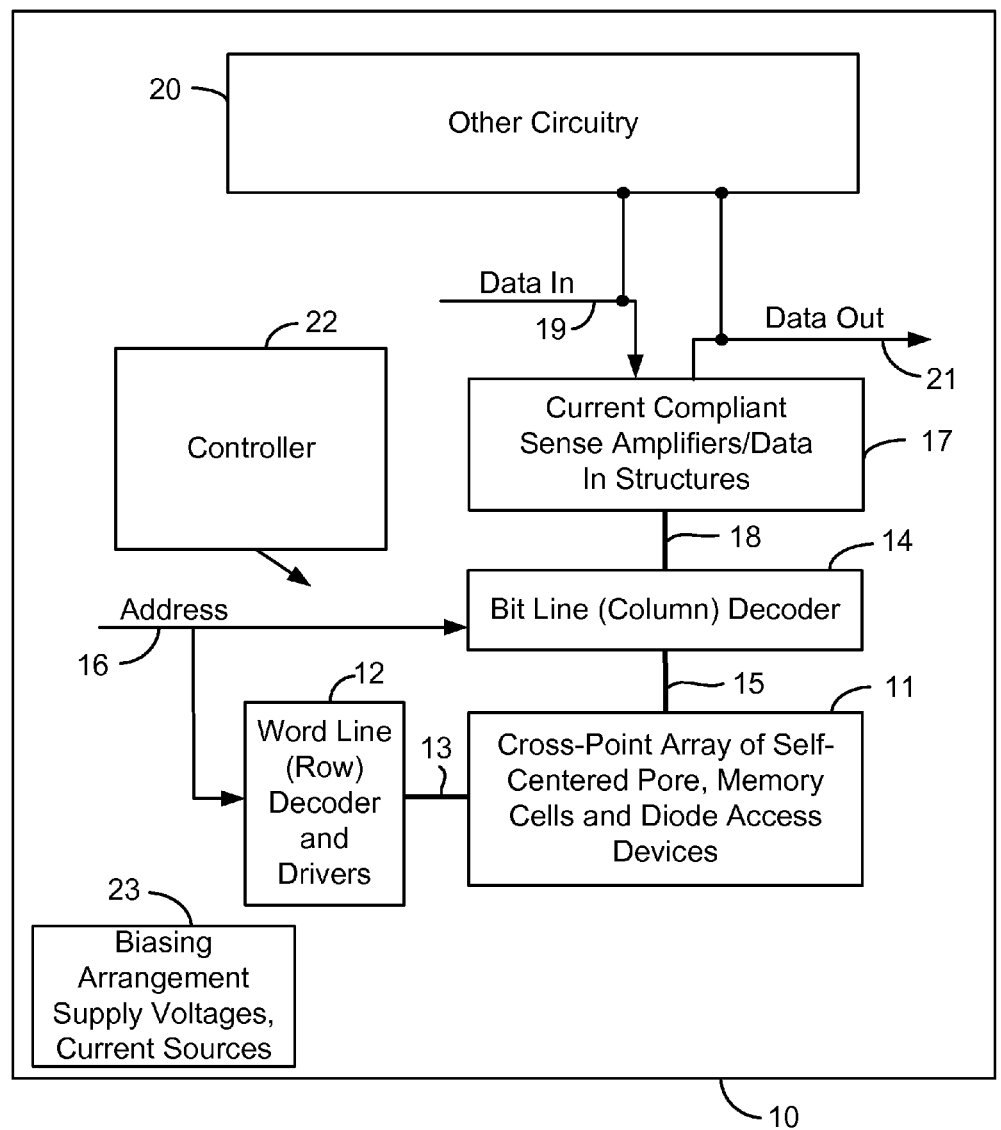
FIG. 1 is a block diagram illustrating a memory array according to the claimed invention.

The following description of the invention will typically be with reference to specific structural embodiments and methods. It is understood that there is no intention to limit the invention to the specifically disclosed embodiments and methods but that the invention may be practiced using other features, elements, methods, and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

With regard to directional descriptions herein, the orientation of the drawings establish their respective frames of reference, with "up," "down," "left" and "right" referring to directions shown on the respective drawings. Similarly, "thickness" refers to a vertical dimension and "width" to the horizontal. These directions have no application to orientation of the circuits in operation or otherwise, as will be understood by those in the art.

A detailed description is provided with reference to FIGS. 1-5.

FIG. 1 is a simplified block diagram of an integrated circuit in accordance with an embodiment. The integrated circuit 10 includes a memory array 11 implemented using self-centered pore, phase change memory cells. The memory cells are arranged in a cross-point array with pillar shaped diode access devices and self-aligned pores filled with memory material on the diodes. A word line (or row) decoder 12 having read, set and reset modes is coupled to and in electrical communication with a plurality of word lines 13, and arranged along rows in the memory array 11. A bit line (column) decoder and drivers 14 are coupled to and in electrical communication with a plurality of bit lines 15 arranged along columns in the memory array 11 for reading data from, and writing data to, the phase change memory cells in the memory array 11. Addresses are supplied on bus 16 to the word line decoder and drivers 12 and the bit line decoder 14. Sense amplifiers and data-in structures in block 17, including current sources for the read, set and reset modes, are coupled to the bit line decoder 14 via data bus 18. Data is supplied via the data-in line 19 from input/output ports on the integrated circuit 10 or from other data sources internal or external to the integrated circuit 10, to the data-in structures in block 17. In the illustrated embodiment, other circuitry 20 is included on the integrated circuit 10, such as a general purpose processor or special purpose application circuitry, or a combination of modules providing system-on-a-chip functionality supported by the phase change memory cell array. Data is supplied via the data-out line 21 from the sense amplifiers in block 17 to input/output ports on the integrated circuit 10, or to other data destinations internal or external to the integrated circuit 10.

A controller implemented in this example, using bias arrangement state machine 22, controls the application of biasing arrangement supply voltages and current sources 23, such as read, program erase, erase verify, program verify voltages, or currents for the word lines and bit lines, and controls the word line/source line operation using an access control process. The controller 22 can be implemented using special purpose logic circuitry as known in the art. In alternative embodiments, the controller 22 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 22.

Figure 2:
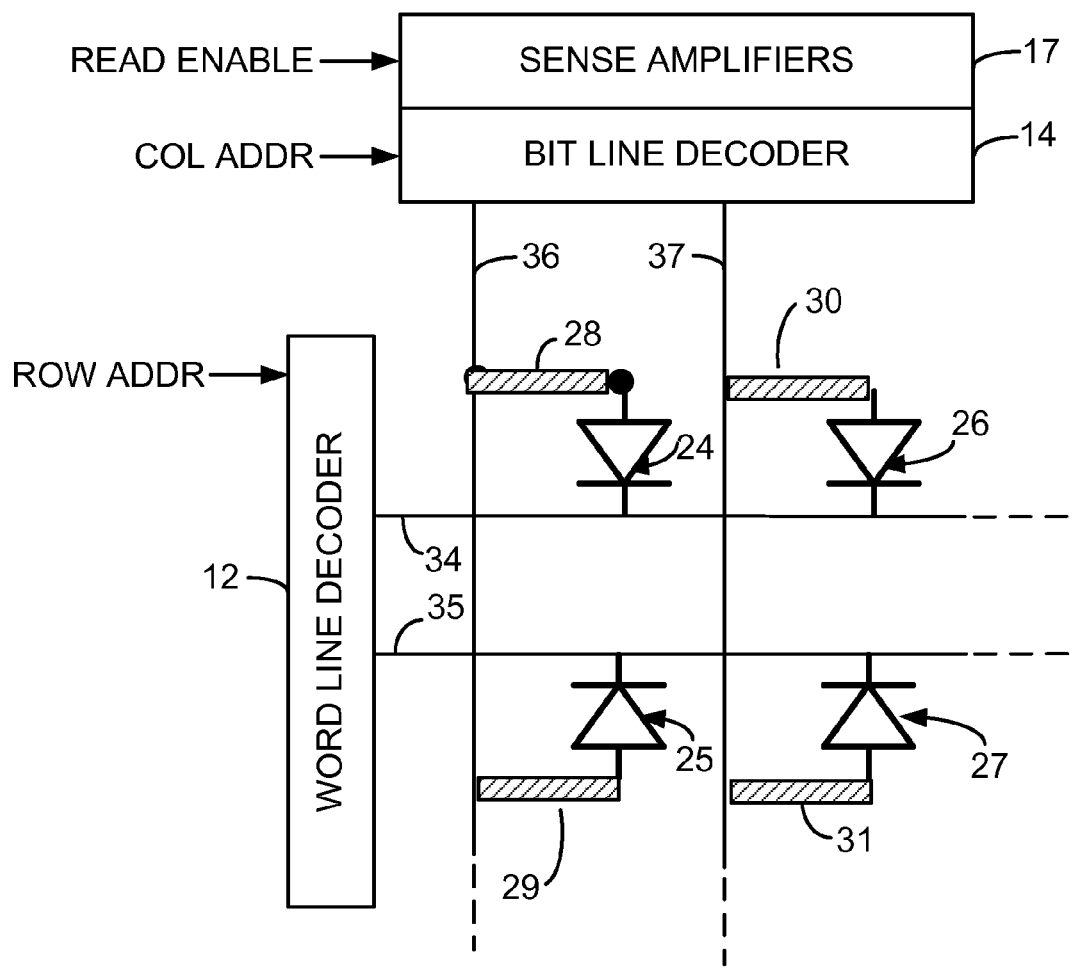
FIG. 2 is a schematic drawing illustrating a memory array according to the claimed invention.

As shown in the schematic diagram of FIG. 2, each of the memory cells of array 11 includes an access diode. Four access diodes are shown as 24, 25, 26, 27 and phase change elements 28, 29, 30, and 31. A plurality of word lines 13 including word lines 34 and 35 extend parallel along a first direction. The word lines 34 and 35 are in electrical communication with the word line decoder 12. The cathodes (or in the alternative, the anodes) of the diodes 24 and 26 are connected to a common word line, such as the word line 34, and the cathodes (or in the alternative, the anodes) of diodes 25 and 27 are connected in common to the word line 35. A plurality of bit lines 15 including bit lines 36 and 37 have one end of phase change elements 28 and 29 connected to the bit line 36. Specifically, the phase change element 28 is connected between the anode of diode 24 and the bit line 36, and the phase change element 29 is connected between the anode of diode 25 and the bit line 36. Similarly, the phase change element 30 is connected between the anode of diode 26 and the bit line 37, and the phase change element 31 is connected between the anode of diode 27 and the bit line 37. It should be noted that four memory cells are shown for convenience of discussion but, in practice, array 11 may comprise thousands to millions of such memory cells. Also, array structures other than cross-point arrays may be used.

Embodiments of the memory cell include phase change based memory materials, including chalcogenide based materials and other materials, for the memory members. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically or by modeling, and specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$. Representative phase change materials include:

$$Ge_xSb_yTe_z$$

Or other compositions with x: 0~5; y: 0~5; z: 0~10
GeSbTe with doping, such as silicon dioxide, N—, Si—, Ti—, or other element doping may also be used.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

An exemplary method for forming chalcogenide material, including doping materials, uses the PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallized state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states. It is expected that some materials are suitable with even lower thicknesses.

Figure 3:
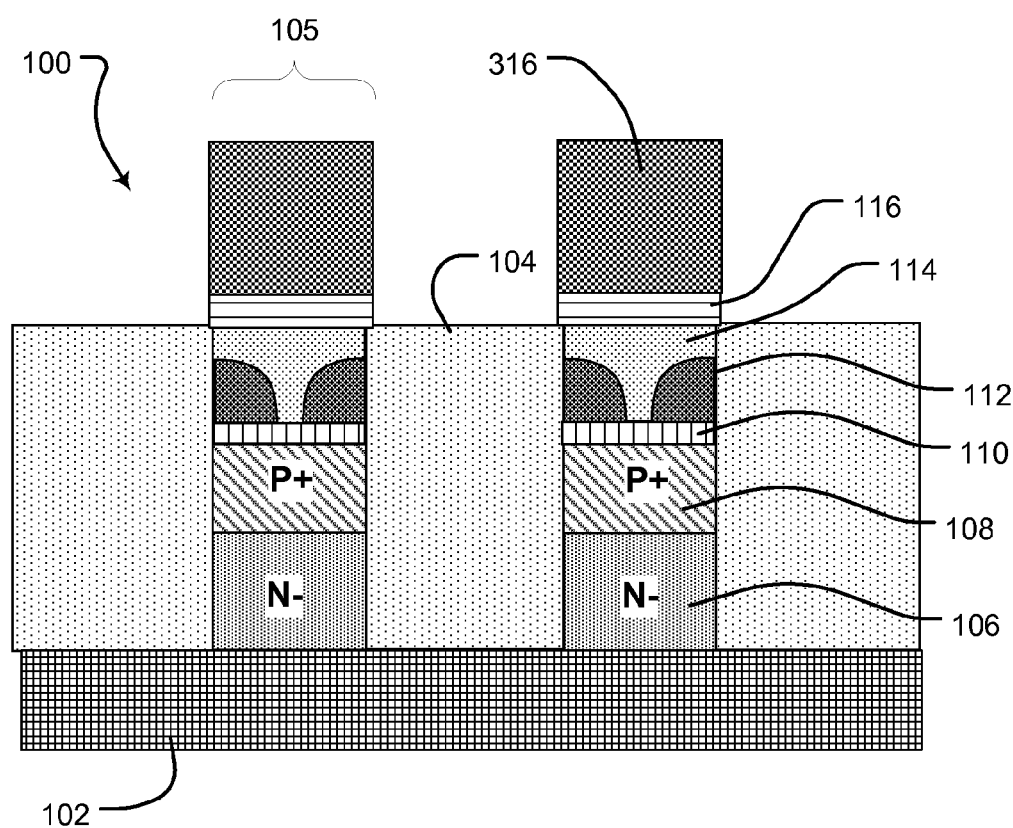
FIG. 3 depicts a memory array of the claimed invention.

An embodiment of a memory array in accordance with the claimed invention is seen in FIG. 3. It will be noted that the drawing depicts an array of two adjacent elements, shown without the components required to connect those elements to other circuitry within or without the semiconductor chip in which they are embedded. Those in the art will understand that the array may be scaled up to several billion elements or more, all exactly as shown, and that the word lines, bit lines and associated devices are entirely conventional and within the skill of one of ordinary skill.

The array 100 as shown includes a conductive layer 102, which the upper portion of the drawing shows to be separated into conductive lines 103 acting in this embodiment as word lines. Alternative embodiments may arrange the array so the conductive lines act as bit lines. As discussed below, two memory elements 105 extend upwardly from the corresponding conductive lines, within vias surrounded by dielectric fill material 104. Each memory element 105 includes, successively from the conductive layer 102 upward, a lightly doped layer of N material (the N− layer) 106, a layer of heavily doped P material (the P+ layer) 108, a conductive cap 110, spacers 112, a memory material layer 114, a top electrode 116, and a bit line 316. The conductive layer 102 extends in a direction parallel to the word lines in the memory array, a direction that may be referred to below as the word line direction and extending parallel to the plane of the drawing sheet. The direction perpendicular to the word line direction, and to the drawing sheet, is the bit line direction. Dimensions and materials associated with the array and individual memory elements are discussed in connection with fabrication processes, below. Conductive cap 110 is formed of a metal silicide, in one embodiment comprising TiS, and in others a silicide containing W, Co, Ni or Ta, chosen for compatibility with the adjoining materials. The conductive cap assists in maintaining the uniformity of the electric field impressed across the memory material layer, by providing a contact surface that is more highly conductive than the semiconductor material in the diode.

It will be noted that the N− and P+ layers define a diode, which serves as an access device to drive the memory cell. U.S. patent application Ser. No. 11/736,440, entitled "4F2 Self align Side Wall Active Phase Change Memory," and Ser. No. 11/777,392, entitled "4F2 Self Align Fin bottom Electrodes FET Drive Phase Change Memory," both owned by the assignees hereof, disclose and claim phase change memory cell arrays, but both these applications and other devices employ transistors as the access devices. Here, the combination of diode drivers and the self-aligned fabrication process reduces the need for additional masks thereby simplifying manufacturing procedures. Being a fully self-aligning process also eliminates the need for alignment of the array and therefore increases the array density. The resulting array of memory cells is a contact electrode-free array, meaning it eliminates the need for additional lithographic steps to create additional contacts to the drain terminals of the access transistors. The elimination of the need for additional contacts helps to reduce the overall size of the memory cell. That size is further reduced by the fact that the driver element is a vertical diode rather than a transistor.

Above the diode lies the memory layer 114, which in the depicted embodiment is formed of a chalcogenide material as described above. Spacers 112 are formed of an insulating material, such as SiN, leaving a relatively small cross-sectional portion of the memory material in contact with the conductive cap 110 and thus the P+ layer 108. This design concentrates current flow in a relatively small portion of the memory material, producing a rapid temperature rise due to joule heating, further producing a rapid phase change. An electrode 116 and bit line 316 contact the memory element.

Figure 4A:
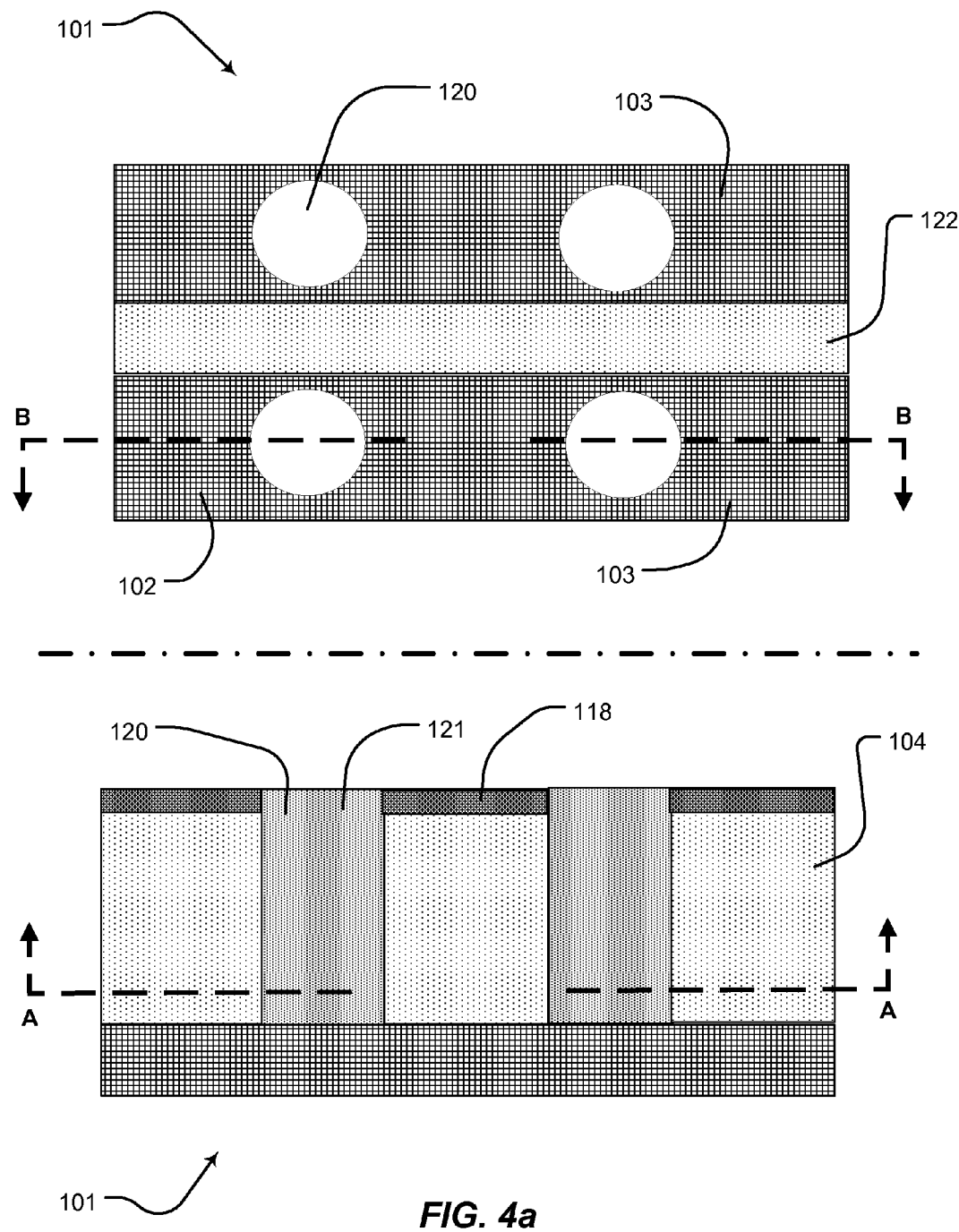
FIGS. 4*a*-4*h* depict an embodiment of a process for fabricating the memory array of FIG. 3.

FIGS. 4a-4h depict fabrication of the embodiment illustrated in FIG. 3. The process begins, as shown in FIG. 4a, by the formation of a structure 101. FIG. 4a includes top and front cross sectional views of the structure, taken along planes A-A and B-B, respectively. It should be noted that the top view does not show the dielectric fill material 104, for purposes of clarity. The word line direction is left and right, parallel to the drawing sheet in both views, while the bit line direction is perpendicular to the front view and up and down, parallel to the drawing sheet, in the top view.

As seen, the lowermost level of the structure is a conductive layer 102. That layer is bisected by a Shallow Trench Isolation (STI) structure 122 running in the word line direction and extending upward the depth of the structure, so that the conductive layer is divided into conductive word lines 103. The trenches are formed by patterned etching processes, as known in the art, and filled with dielectric fill material, such as $SiO_2$. Vias 120 are formed in the structure, extending from the conductive lines completely through the structure, generally circular in form, as is conventionally accomplished. It is preferred that the width or diameter of vias 120 be close to the minimum feature size of the process used, typically a minimum lithographic feature size, to create the opening. Using conventional lithographic techniques, the width or diameter of a via 120 can be about 90 nm and will typically vary about 5% to 10%, which is about 4.5 nm to about 9 nm.

These vias are filled with Si, either formed by appropriate deposition techniques or grown in place, to form silicon plugs 121. A sacrificial layer 118 is formed atop the structure, preferably formed of SiN or similar material. The sacrificial layer material is specifically chosen for the ability to selectively etch that material and the dielectric fill material.

FIGS. 4b-4h focus on single memory elements, to show clearly the process steps. It will be understood that the process performs identical actions on all of the elements in an array.

Figure 4B:
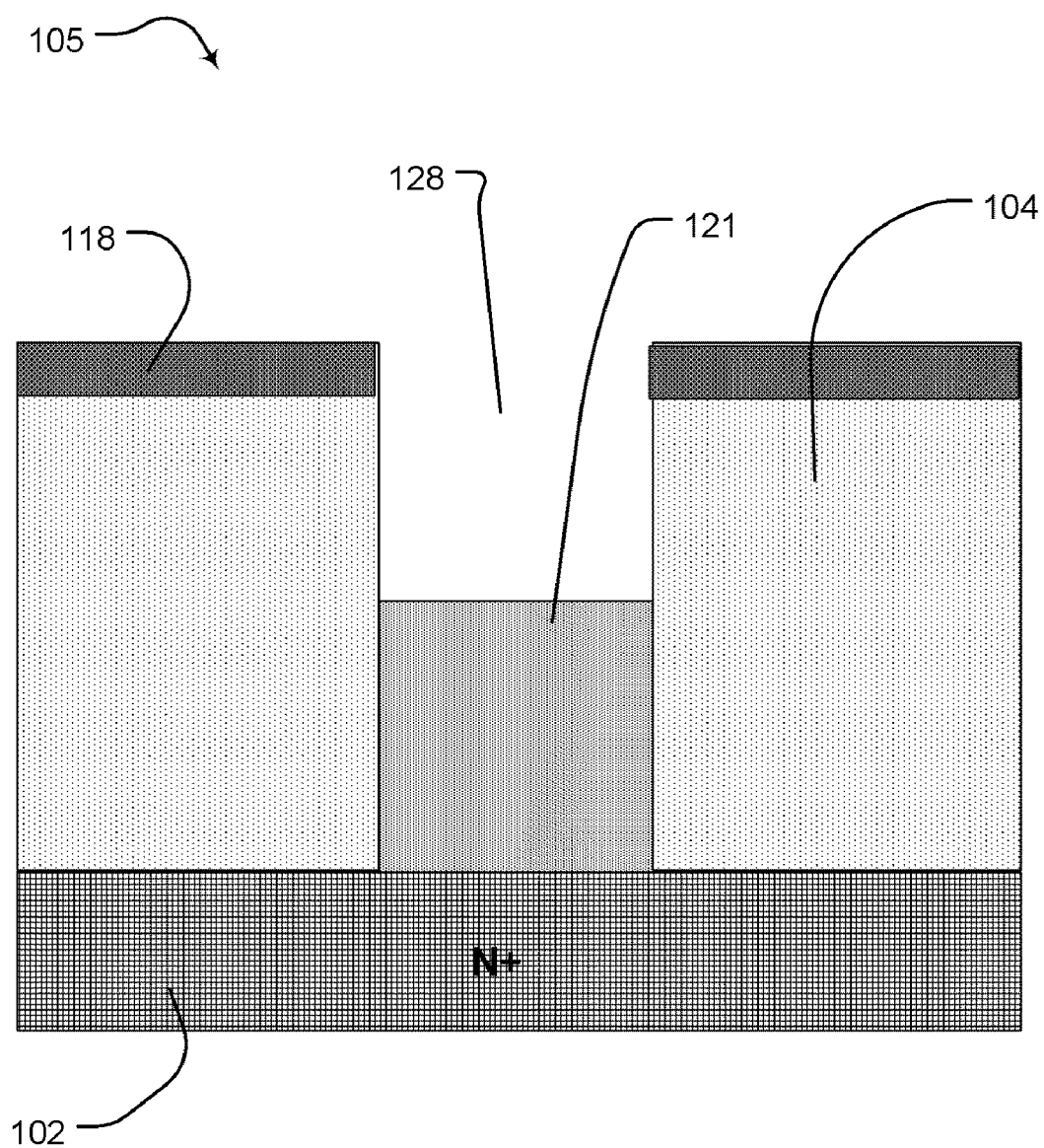
Figure 4C:
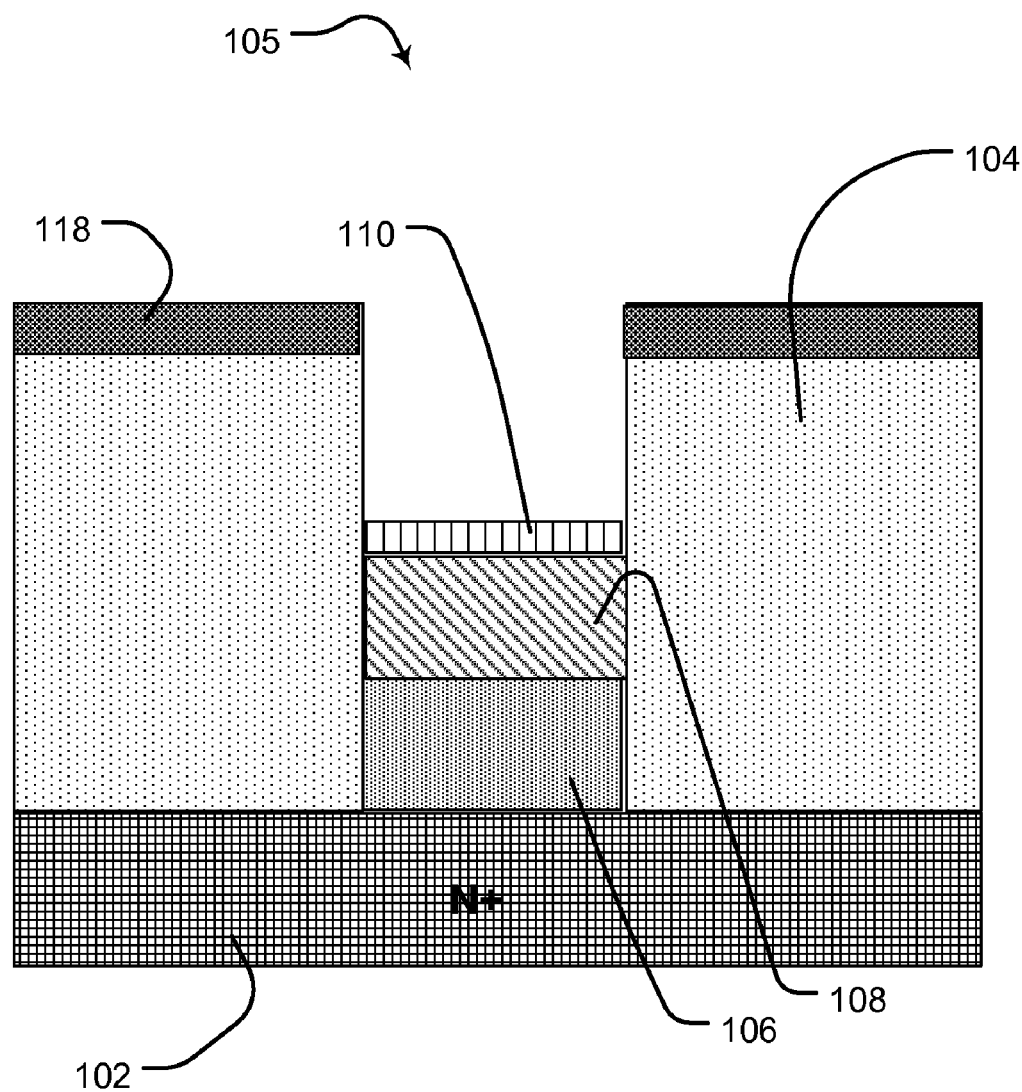

Initially, as seen in FIG. 4b, the Si plug 121 is etched back, leaving a recess 128 extending for example about half way into the via, or more generally, to a depth sufficient to support the balance of the process described below. This step can be performed employing any etch chemistry that preferentially removes Si, rather than SiN or the dielectric fill material. The silicon plug is then processed to form a diode, shown in FIG. 4c, forming an N− layer 106 and a P+ layer 108, by ion implantation of the dopants. The diode can be about 200 nm in thickness, above the conductive lines. The conductive cap 110 is formed by a silicide formation process, and can be about 20 nm thick. Note that the thickness dimension as used herein denotes the vertical direction on FIG. 4b, from the conductive layer to the upper edge of the memory cell, or vice versa.

In another embodiment of the process, the diode is formed by depositing layers of appropriately doped polysilicon, in successive layers, to form the N− and P+ layers. For example, in one process, a first layer of doped polysilicon is deposited using a CVD process, followed by an etch back to a selected depth inside the via, followed by a second layer of doped polysilicon deposited using a CVD process, followed by an etch back to a second selected depth inside the via.

Figure 4D:
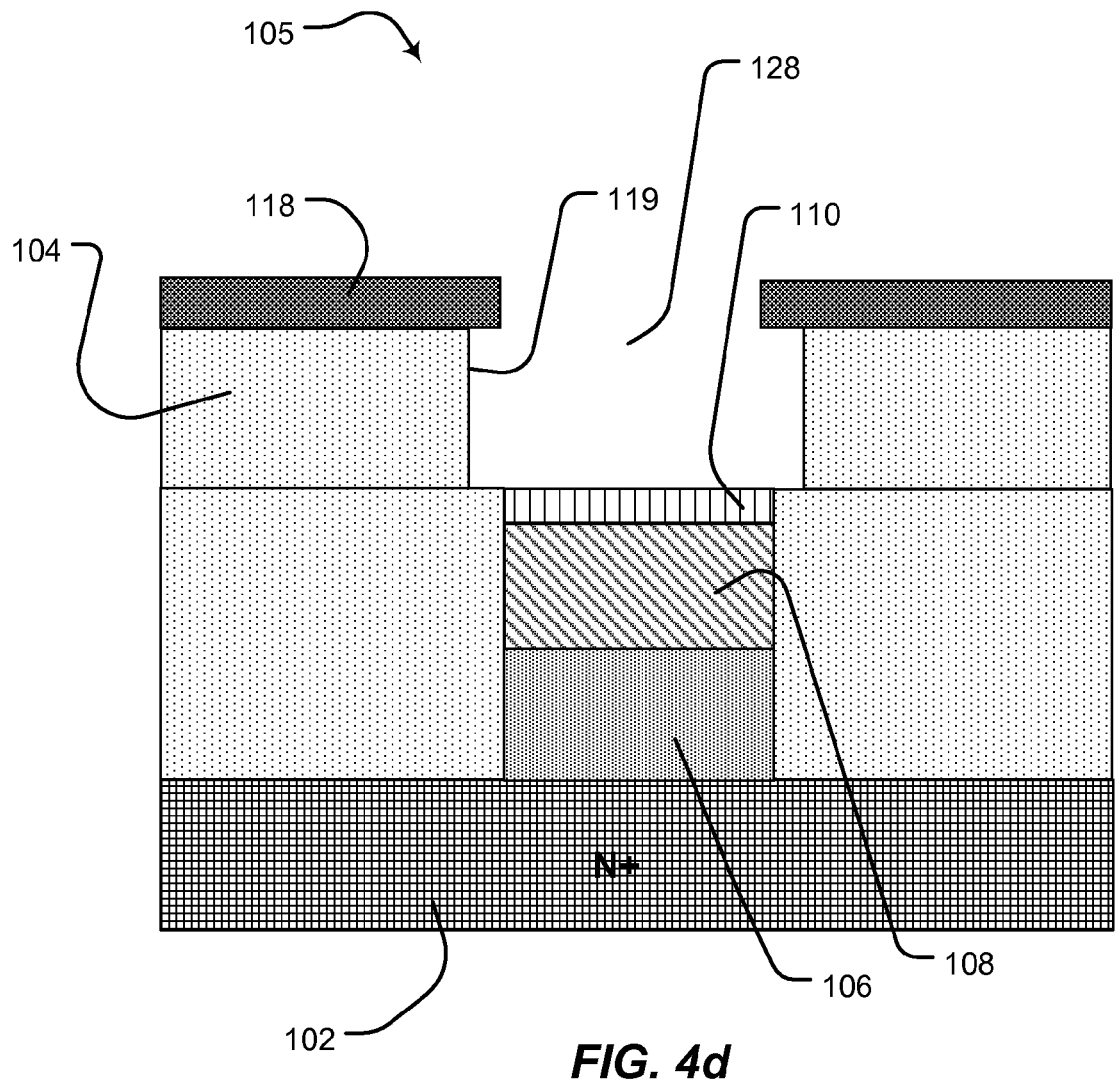

Next, the recess 128 is enlarged by undercutting the dielectric fill material 104 lying beneath the sacrificial layer 118, as shown in FIG. 4d, such as applying dilute HF solution to slowly remove silicon dioxide in the dielectric fill material while leaving the silicon nitride sacrificial layer 118 intact. An isotropic etchant the preferentially etches the oxide material of the dielectric fill is employed for this operation, resulting in the side walls 119 of the recess being cut back from the lip of the SiN layer. See, U.S. patent application Ser. No. 11/855,979 filed 14 Sep. 2007, entitled "Phase Change Memory Cell In Via Array With Self-Aligned, Self-Converged Bottom Electrode And Method For Manufacturing," commonly owned with the present application.

Figure 4E:
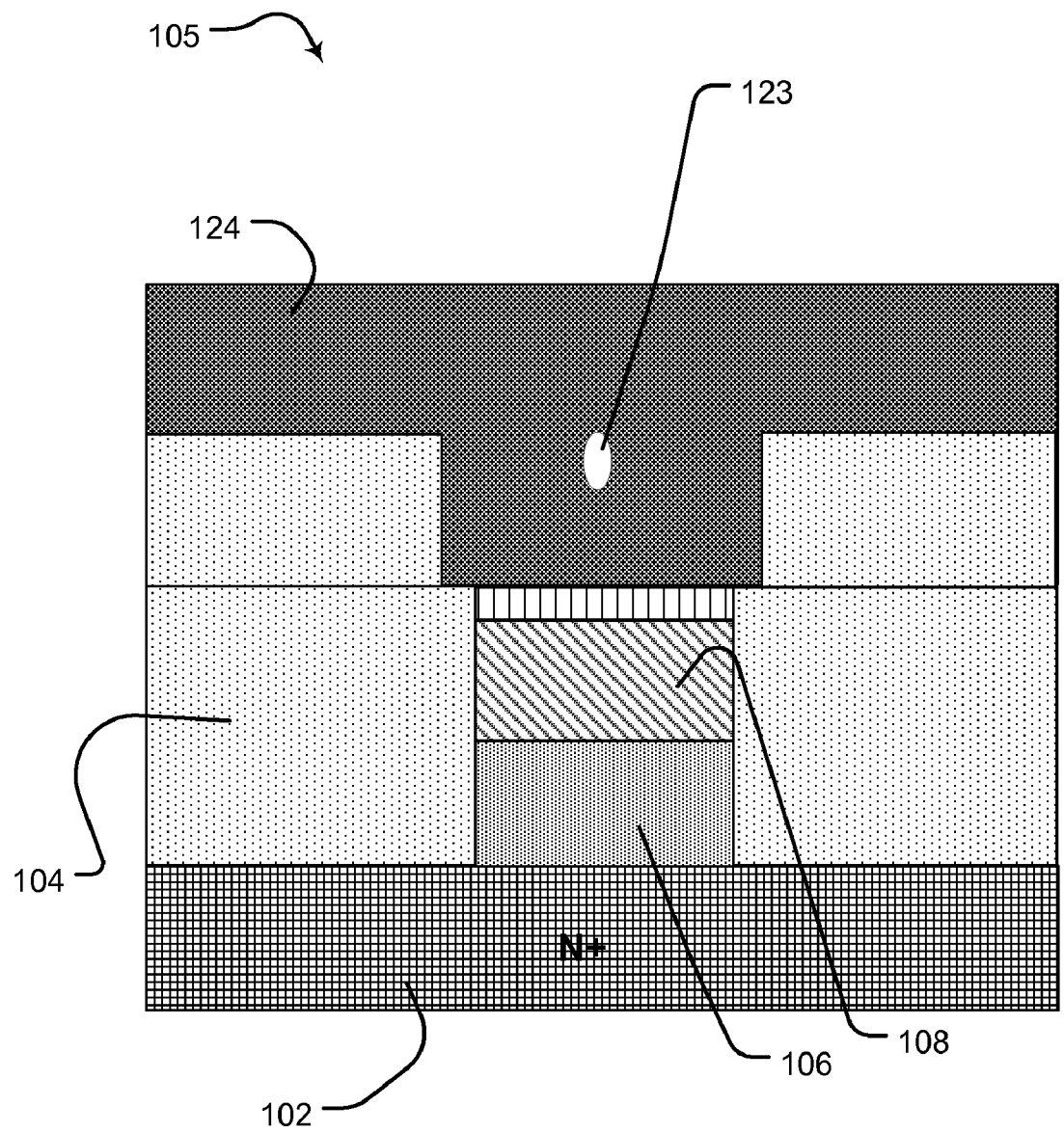

The undercutting step is the initial portion of the formation of a "keyhole" structure, as seen in FIG. 4e. That structure results from chemical vapor deposition of a fill material 124, such as amorphous silicon or other materials, using a process that grows the silicon layer at a substantially equal rate on the walls of the upper and lower opening segments, resulting in the formation of a void 123 when the top of the opening closes before the interior is filled. Other materials chosen for their etch chemistry and the ability to grow conformal layers within high aspect ratio vias could also be used as the fill material 124. Procedures such as atomic layer deposition, physical vapor deposition, low-pressure chemical vapor deposition (LPCVD) or high density plasma chemical vapor deposition (HDPCVD) could be used to deposit the fill material 124, depending on the materials and geometries involved.

The fill deposition creates a self-aligned void 123 within the fill material 124. The lateral size or width of the void 123 is primarily controlled by the overhang dimension of sacrificial layer 118 and by variations in the deposition rates within the lower and upper opening segments, independent of the lithographic process used to form the openings.

Figure 4F:
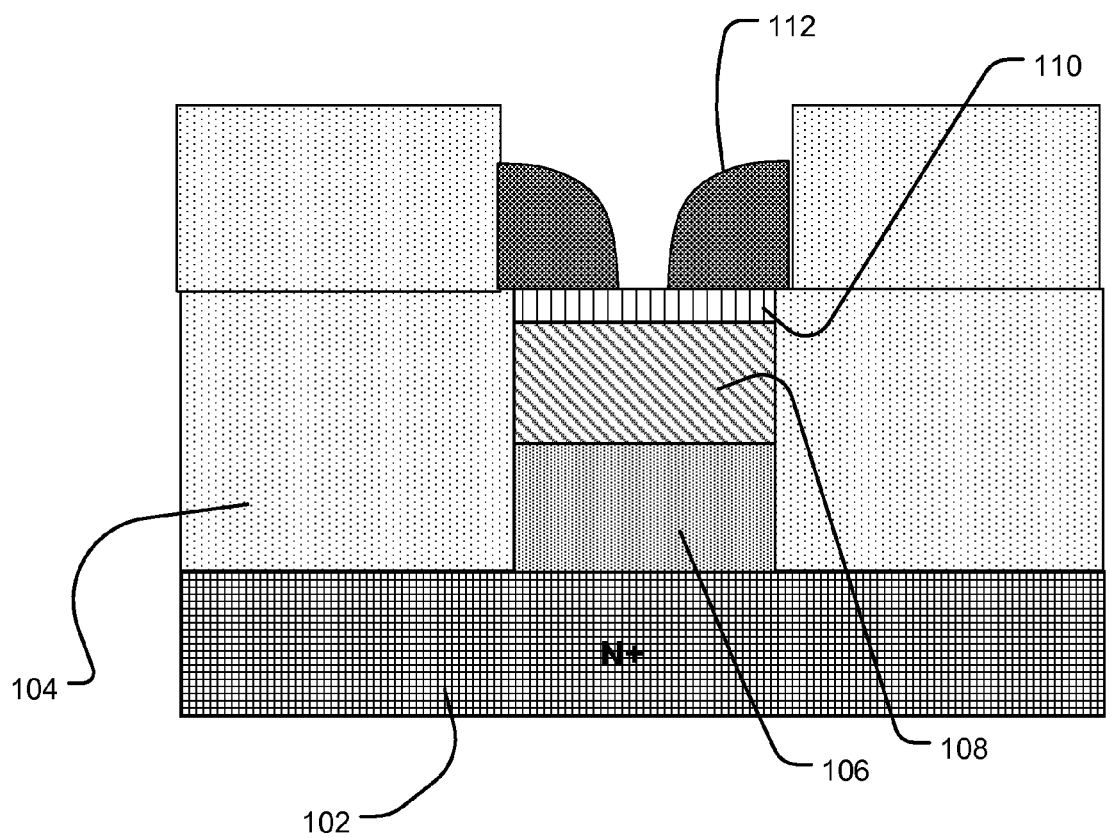

Void 123 facilitates the subsequent etching of the additional silicon layer to form SiN spacers 112, as seen in FIG. 4f. An anisotropic etching process preferentially etches silicon to completely remove the additional silicon layer, leaving only the spacers. The void allows etchant to penetrate into the middle of the silicon layer to produce the spacers rather than the level structure that otherwise would be formed by a conventional etch process. The process by which the void 123 was formed causes self-centering, and self-alignment for the opening defined by spacers 112. It should be noted that the process set out herein results in a low variability in the location of the void 123, owing to the self-aligned nature of the process. It has been found that the cell-to-cell variation in the position of the width of the void is less than the variation in width of the vias 120.

Figure 4G:
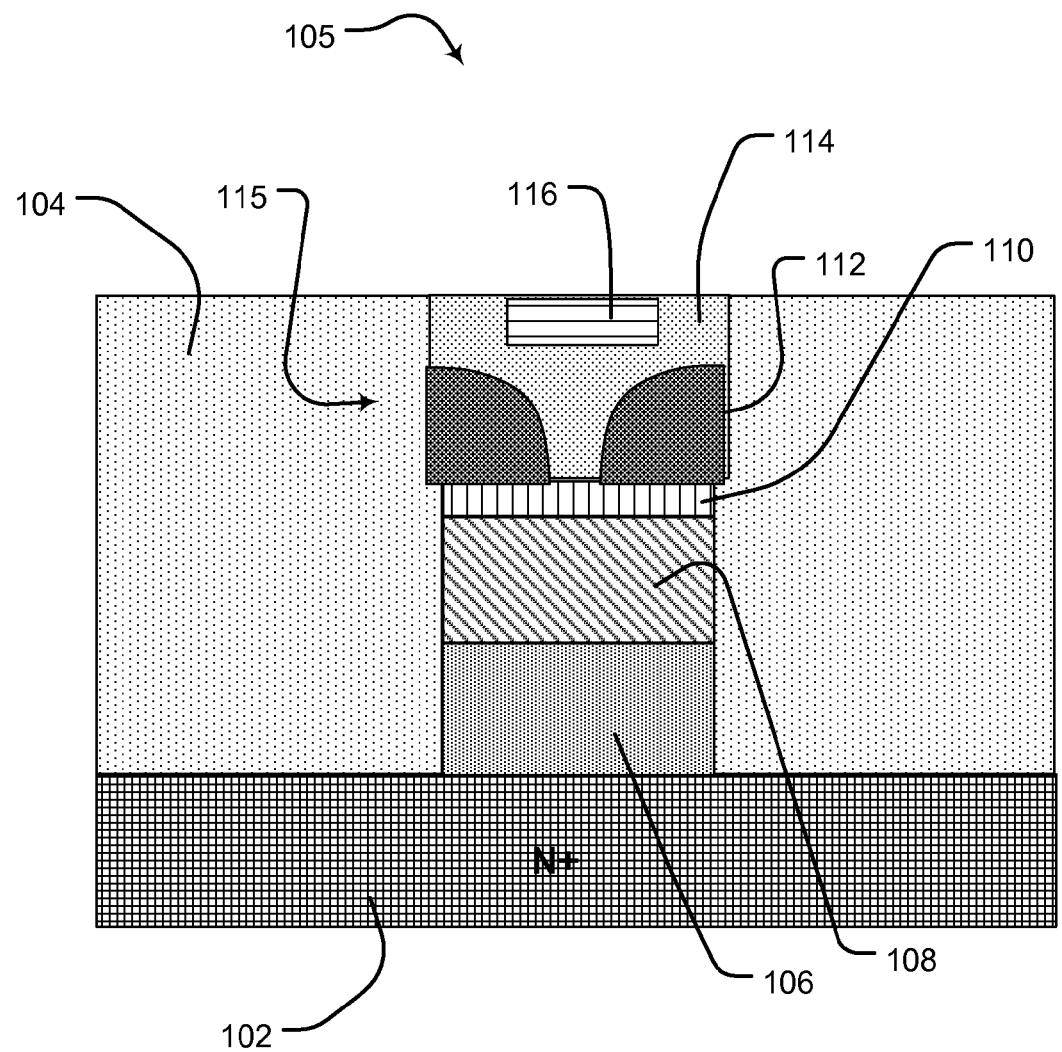

FIG. 4g illustrates the deposition of memory material 114, and the top electrode 116, forming memory element 115 for one embodiment, in which the electrode 116 fills a recess in the memory material 114. FIG. 3 illustrates another arrangement of the top electrode 116. It will be noted that spacers 112 provide a relatively small contact area at the bottom of memory material 114, compared with the size of both the conductive cap 110 and the top electrode 116. That size differential serves to concentrate current in the portion of the memory material lying between the spacers, which in turn increases the phase change or resistance change of that material. Deposition can be performed by conventional Chemical Vapor Deposition (CVD) or (Physical Vapor Deposition (PVD) techniques. The deposition is followed by a chemical mechanical polishing CMP step, to planarize the memory material 114 as shown in FIG. 3. As shown in FIG. 3, after planarizing the memory material, a top electrode material and a bit line material are deposited and patterned to form bit lines. Alternatively, for example when PVD is used for depositing the memory material 114, a wine glass shape memory element is formed as shown in FIG. 4g. Then, the top electrode 116 is formed, filling the recess in the wine glass shaped memory material. The upper surface of the resulting structure is planarized. The top electrode material is TiN in the illustrated embodiments, with other embodiments employing similar materials, such as TaN. Alternatively, the top electrode layer can be TiAlN or TaAlN, or it can comprise, in further examples, one or more elements selected from the group consisting of Ti, W, Mo, Al, Ta, Cu, Pt, Ir, La, Ni, and Ru and alloys thereof.

Figure 4H:
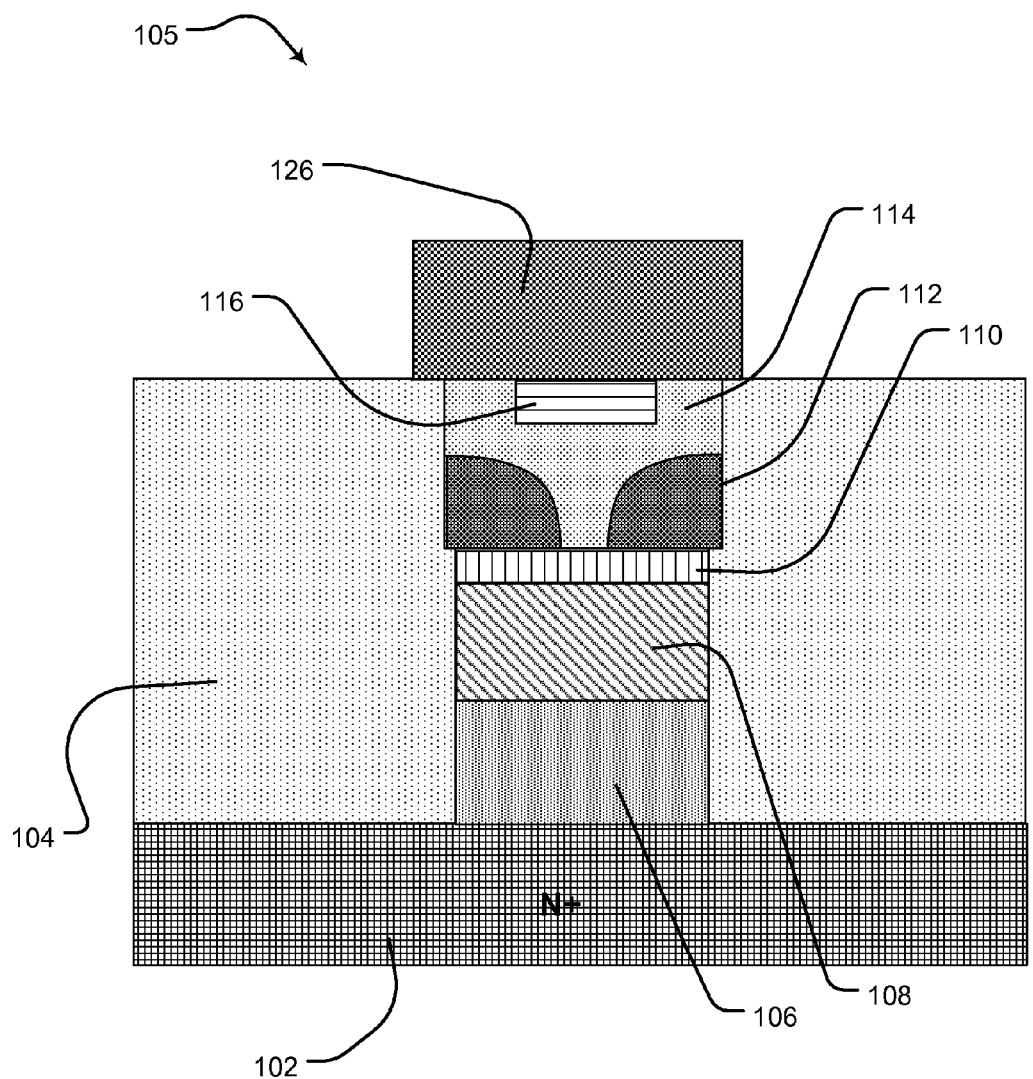

Finally, in FIG. 4h, bit line 126 is formed by deposition and patterning, to provide a series of connectors running atop the structure, perpendicular to the word lines. The bit line can be formed from whatever metallizing material is chosen for the circuit, such as Cu or Al. A similar bit line structure us shown in FIG. 3.

Figure 5:
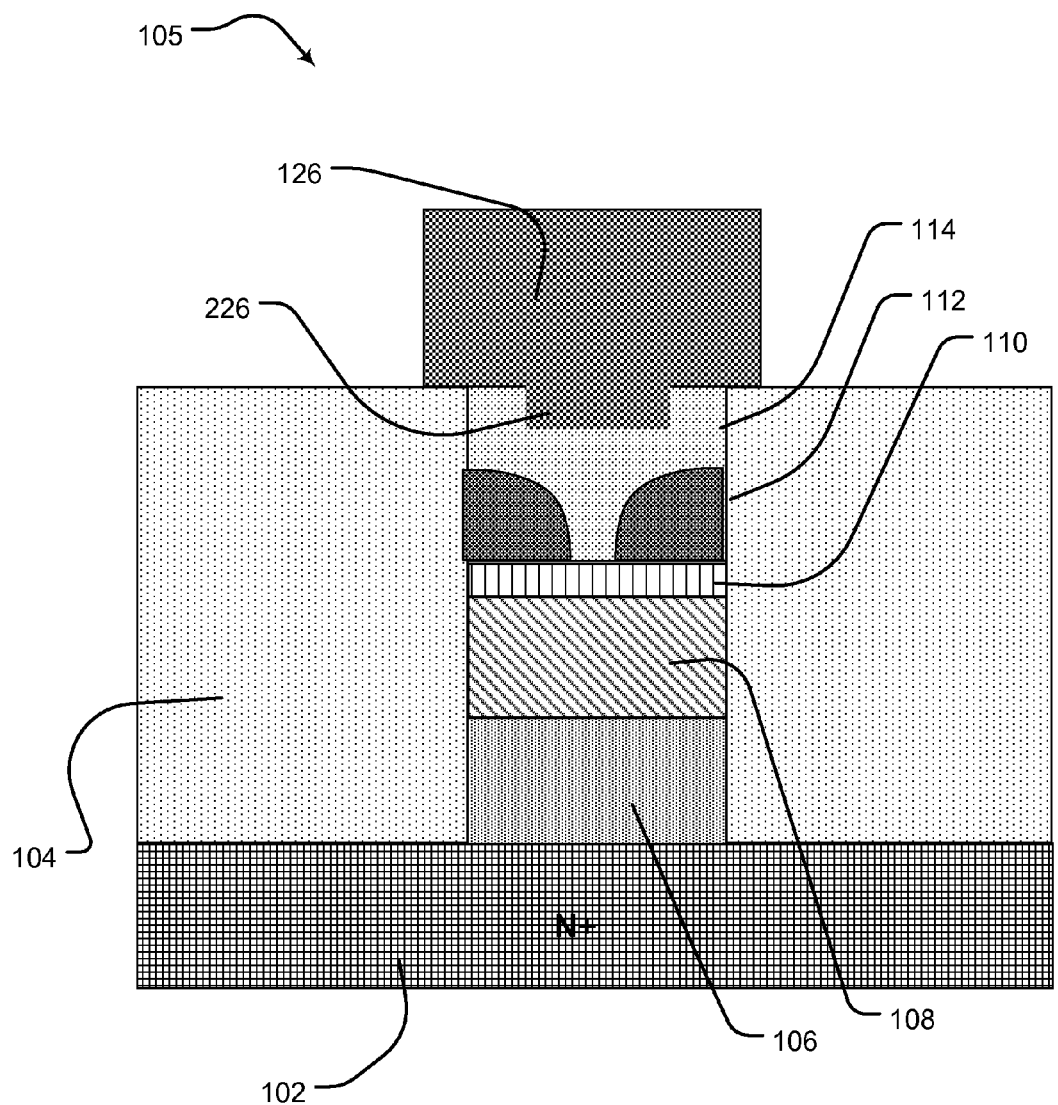
FIG. 5 depicts an alternative embodiment of a process for fabricating the memory array of FIG. 3.

An alternate embodiment of the last portion of the process is shown in FIG. 5. This process branches from the embodiment described above after deposition of the memory material 114. At that point, rather than forming a separate top electrode, a CMP planarization is applied to the upper surface of the element, and an etch process preferably is performed to etch back the memory material in the upper part of the via. Then, bit line 126, is deposited atop the cell. Here, the bit line makes direct contact with the memory material, with a protrusion 226 extending into any recess on the top surface that remains after the etch back, at the time of the deposition.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

What is claimed is:

1. A memory array, comprising:
   a structure, including dielectric fill material and having conductive lines at a lower portion thereof;
   a plurality of diodes, each diode in the plurality of diodes having a first semiconductor layer having a first conductivity type, coupled to a corresponding conductive line in the structure, a second semiconductor layer having a second conductivity type, and a contact surface over the second semiconductor layer;
   vias in the dielectric fill material, and aligned with and overlying respective diodes on the plurality of diodes;
   spacers on interior sidewalls of the vias in contact with respective diodes, each spacer defining a self-centered opening in the center of the via exposing the contact surface of the respective diode, wherein the variability in width among the self-centered openings is less than the variability in width among the plurality of vias;
   memory material within the self-centered openings upward from the contact surface of the respective diodes, the memory material making contact with the contact surface; and
   a top electrode in contact with the memory material.

2. The memory array of claim 1, wherein the portion of the memory material making contact with the contact surface is substantially smaller in cross-sectional area than the portion of the memory material making contact with the top electrode.

3. The memory array of claim 1, wherein the diode is about 200 nm, or less, thick.

4. The memory array of claim 1, wherein the first conductivity type is n-type.

5. The memory array of claim 1, wherein the first conductivity type is p-type.

6. The memory array of claim 1, wherein the diodes include a layer of conductive cap material over the second semiconductor layer, and the contact surface is on the layer of conductive cap material.

7. The memory array of claim 1, wherein the diodes include a layer of metal silicide over the second semiconductor layer, and the contact surface is on the layer of metal silicide.

8. The memory array of claim 7, wherein the metal silicide comprises a silicide including a metal selected from among the group consisting of Ta, Ti, W and Co.

9. The memory array of claim 1, wherein the memory material comprises an alloy including a combination of two or more materials from the group of Ge, Sb, Te, Se, In, Ti, Ga, Bi, Sn, Cu, Pd, Pb, Ag, S, and Au.

* * * * *